US012655834B2

(12) United States Patent
Yoshida et al.

(10) Patent No.: US 12,655,834 B2
(45) Date of Patent: Jun. 16, 2026

(54) DIAPHRAGM AND CHEMICAL FLOW CONTROL DEVICE

(71) Applicant: CKD CORPORATION, Aichi (JP)

(72) Inventors: Masaki Yoshida, Aichi (JP); Yoshifumi Nishio, Aichi (JP); Takayuki Kumagai, Aichi (JP); Shigenobu Nishida, Aichi (JP)

(73) Assignee: CKD Corporation, Aichi (JP)

( * ) Notice: Subject to any disclaimer, the term of this patent is extended or adjusted under 35 U.S.C. 154(b) by 129 days.

(21) Appl. No.: 18/658,346

(22) Filed: May 8, 2024

(65) Prior Publication Data

US 2024/0287977 A1      Aug. 29, 2024

Related U.S. Application Data

(63) Continuation of application No. PCT/JP2022/039090, filed on Oct. 20, 2022.

(30) Foreign Application Priority Data

Dec. 17, 2021  (JP) ................................. 2021-205196
Oct. 19, 2022  (JP) ................................. 2022-167532

(51) Int. Cl.
*F04B 43/00*      (2006.01)
*B32B 27/08*      (2006.01)
(Continued)

(52) U.S. Cl.
CPC .......... *F04B 43/0054* (2013.01); *B32B 27/08* (2013.01); *B32B 27/306* (2013.01);
(Continued)

(58) Field of Classification Search
CPC .... F04B 43/0054; F04B 43/009; F04B 43/06; F04B 43/02; F04B 19/006; B32B 27/08; B32B 27/40; B32B 27/306; F16J 3/02
See application file for complete search history.

(56) References Cited

U.S. PATENT DOCUMENTS 3,839,075  A  *  10/1974  Moriyama ................. C09J 7/50
                                                          428/458
5,349,896  A  *   9/1994  Delaney, III ........ F04B 43/0054
                                                         92/103 SD
(Continued)

FOREIGN PATENT DOCUMENTS

CN          100562664 C      11/2009
CN          109563796 A       4/2019
(Continued)

OTHER PUBLICATIONS

Notice of Reasons for Refusal issued in corresponding Japanese Patent Application No. 2022-167532, dated Jun. 18, 2024 (6 pages).
(Continued)

*Primary Examiner* — Peter J Bertheaud
(74) *Attorney, Agent, or Firm* — Osha Bergman Watanabe & Burton LLP

(57)            ABSTRACT
A diaphragm to be used in a chemical flow control device that controls a flow of a chemical in a semiconductor manufacturing process and to which a pressure of a working gas is applied. The diaphragm includes a membrane portion and a permeation reduction layer. The membrane portion is made of fluoroplastic that is resistant to the chemical. The permeation reduction layer is less likely to pass the working gas in comparison to the membrane portion and disposed on a surface of the membrane portion to which the pressure of the working gas is applied.

18 Claims, 3 Drawing Sheets

(51) Int. Cl.

| | | |
|---|---|---|
| *B32B 27/30* | (2006.01) | |
| *F04B 19/00* | (2006.01) | |
| *F04B 43/02* | (2006.01) | |
| *F04B 43/06* | (2006.01) | |
| *F16J 3/02* | (2006.01) | |
| *H10P 72/00* | (2026.01) | |

(52) U.S. Cl.

CPC .......... *F04B 19/006* (2013.01); *F04B 43/009* (2013.01); *F04B 43/02* (2013.01); *F04B 43/06* (2013.01); *F16J 3/02* (2013.01); *H10P 72/0402* (2026.01)

(56) References Cited

U.S. PATENT DOCUMENTS

| | | | |
|---|---|---|---|
| 8,197,031 B2 * | 6/2012 | Stephens .............. | B41J 2/14233 347/68 |
| 2007/0258837 A1 | 11/2007 | Okumura et al. | |
| 2019/0162177 A1 * | 5/2019 | Kuroki ................... | F04B 53/06 |
| 2022/0412337 A1 | 12/2022 | Kuroki et al. | |

FOREIGN PATENT DOCUMENTS

| | | |
|---|---|---|
| JP | 2006-77712 A | 3/2006 |
| JP | 2012-17658 A | 1/2012 |
| JP | 2013-227870 A | 11/2013 |

OTHER PUBLICATIONS

Office Action issued in corresponding Taiwanese Application No. 111140430, dated Oct. 1, 2024, with translation (12 pages).
Office Action issued in Taiwanese Application No. 111140430; Dated Aug. 16, 2023, with translation (11 pages).
Office Action issued in Taiwanese Application No. 111140430; Dated Mar. 7, 2024, with translation (11 pages).
International Search Report issued in corresponding International Application No. PCT/JP2022/039090, dated Dec. 13, 2022, with translation (5 pages).
Written Opinion issued in corresponding International Application No. PCT/JP2022/039090, dated Dec. 13, 2022, with translation (3 pages).
International Preliminary Report on Patentability issued in corresponding International Application No. PCT/JP2022/039090 mailed Jun. 27, 2024 (10 pages).
Office Action issued in counterpart Korean Patent Application No. 10-2024-7011538 mailed Nov. 20, 2025 (13 pages).

\* cited by examiner

DIAPHRAGM AND CHEMICAL FLOW CONTROL DEVICE

CROSS-REFERENCE TO RELATED APPLICATION

The present application is a continuation of International Patent Application No. PCT/JP2022/039090 filed on Oct. 20, 2022, and claims priority to Japanese Patent Applications No. 2021-205196 filed on Dec. 17, 2021 and No. 2022-167532 filed on Oct. 19, 2022, which are incorporated by reference in their entirely.

BACKGROUND

Technical Field

The present disclosure relates to a diaphragm used in a chemical flow control device for controlling flow of chemicals.

Description of the Related Art

A known diaphragm pump (a chemical flow control device) in a chemical supply system for applying a chemical such as a photoresist to a semiconductor wafer includes a diaphragm that partitions an internal space of a pump housing into a pump chamber and a working chamber. When working air is supplied and a pressure is applied to the working chamber, the diaphragm deforms toward the pump chamber, which results in discharge of the photoresist.

If the photoresist (the chemical) contains bubbles, defects may be present in patterns on a semiconductor wafer. To reduce such defects, a degassing process may be required for removing the bubbles from the photoresist. Although microbubbles have not been a problem, they are now new issues because they may cause defects in patterns that have been miniaturized. The discloser of the present disclosure investigated the cause of the microbubbles in the photoresist and determined that a slight amount of working air that applies a pressure to the diaphragm passes through the diaphragm and creates the microbubbles.

SUMMARY

The present disclosure has been made to solve such problems. An object is to provide a diaphragm for a chemical flow control device to reduce microbubbles in a chemical.

A first aspect of the present disclosure provides a diaphragm to be used in a chemical flow control device that controls a flow of a chemical in a semiconductor manufacturing process and to which a pressure of a working gas is applied. The diaphragm includes a membrane portion and a permeation reduction layer. The membrane portion is made of fluoroplastic that is resistant to the chemical. The permeation reduction layer is less likely to pass the working gas in comparison to the membrane portion and disposed on a surface of the membrane portion to which the pressure of the working gas is applied.

According to the configuration, a slight amount of the working gas may pass through the diaphragm when the pressure of the working gas is applied to the diaphragm, which may result in microbubbles in the chemical.

Because the membrane portion that is made of fluoroplastic resistant to the chemical, the membrane portion is less likely to be corroded by the chemical. Because the permeation reduction layer is on the surface of the membrane portion to which the pressure of the working gas is applied, even if the pressure of the working gas is applied to the diaphragm, the permeation of the working gas through the diaphragm can be reduced. Therefore, a reduced amount of the microbubbles may be contained in the chemical.

Because the permeation reduction layer is disposed on the surface of the membrane portion to which the pressure of the working gas is applied, that is, the surface that is apart from a surface of the membrane portion to contact the chemical, the permeation reduction layer is less likely to be corroded by the chemical.

In a second aspect, the permeation reduction layer may be attached to the membrane portion with a double-sided tape. Because the double-sided tape is deformable, the double-sided tape and the permeation reduction layer can more easily deform along the deformation of the membrane portion in comparison to a configuration in which the permeable reduction layer is attached to the membrane portion with a curable adhesive. Further, when the pressure of the operating gas is applied to the membrane portion and the membrane portion is deformed, a force may be exerted on the permeation reduction layer by the membrane portion. Such a force can be absorbed by the double-sided tape. Therefore, the permeation reduction layer is less likely to be peeled off from the membrane portion or to be damaged.

In general, the surface of the membrane portion made of a fluoroplastic is inert and thus attachment of other members to the surface may be difficult.

In a third aspect, the membrane portion and the double-sided tape may be surface-treated to activate the surface of the membrane portion. This can improve the bonding between the membrane portion and the double-sided tape. Although the membrane portion may be repeatedly deformed, the double-sided tape and the permeation reduction layer are less likely to be peeled off from the membrane portion.

In a fourth aspect, the permeation reduction layer may be made of polyvinylidene chloride or ethylene-vinyl alcohol copolymer. The polyvinylidene chloride has an advantageous effect in reducing the permeation of gas. This has been confirmed by the discloser. Therefore, even if the pressure of the working gas is high, the working gas is less likely to pass through the diaphragm.

In a fifth aspect, the permeation reduction layer may have a thickness in a range of 10 to 40 [μm]. The permeation reduction layer that may have the thickness of 10 [μm] or greater can achieve an advantageous gas barrier property and the permeation reduction layer that may have the thickness of 40 [μm] or less is less likely to adversely affect the function of the diaphragm. This has been confirmed by the discloser.

The membrane portion of the diaphragm may be deformed due to the pressure of the working gas. If another layer is disposed on the membrane portion, the layer may disturb the deformation of the membrane portion.

In a sixth aspect, the permeation reduction layer may include a surface that is apart from the membrane portion and on which no layer is stacked and the membrane portion may include a surface that may contact the chemical and on which no layer is stacked. The diaphragm may have a minimum required configuration, that is, a layer that may disturb the deformation of the membrane portion may not exist.

In general, the diaphragm that is used in a pump for suction and discharge of a chemical has a large area. Therefore, an amount of the working gas that passes through the diaphragm may be large.

A seventh aspect provides a chemical flow control device that includes the diaphragm in any one of the first to the sixth aspects. The chemical flow control device is used as a pump that performs the suction and the discharge of the chemical. According to the configuration, the working gas is less likely to pass through the diaphragm in the pump.

An amount of the working gas that passes through the diaphragm may increase as the operating pressure increases.

In an eighth aspect, the operating gas is less likely to pass through the diaphragm in the chemical flow control device in which the pressure of the working gas applied to the diaphragm is in a range of 150 to 300 [kPa].

BRIEF DESCRIPTION OF THE DRAWINGS

The above and other objects, features, and advantages of the present disclosure will be apparent from the following detailed description made with reference to the accompanying drawings.

DETAILED DESCRIPTION OF EMBODIMENTS

An embodiment that includes a diaphragm pump for suction and discharge of a photoresist in a semiconductor manufacturing process will be described with reference to the drawings.

Figure 1:
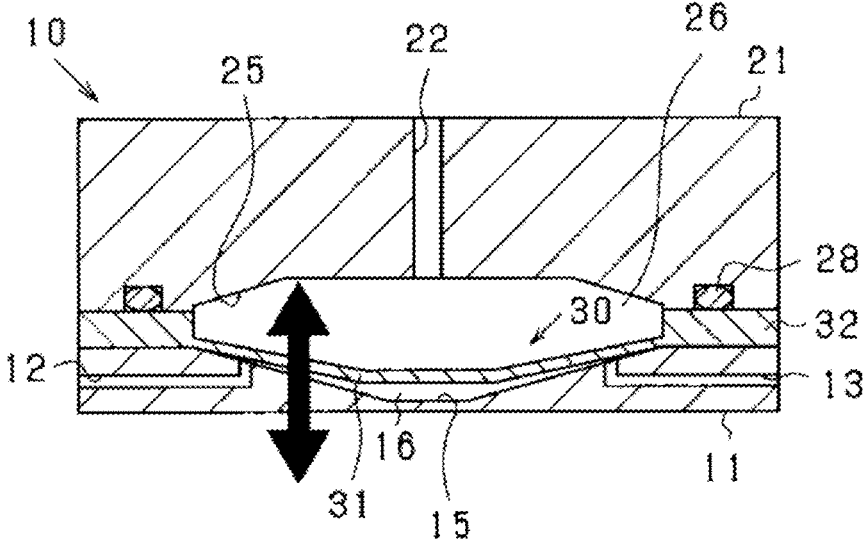
FIG. 1 is a schematic view of a diaphragm pump.

As illustrated in FIG. 1, a diaphragm pump 10 (a chemical flow control device) includes pump housings 11 and 21 and a diaphragm 30. FIG. 1 illustrates a part of the diaphragm pump 10.

The pump housings 11 and 21 include portions that are opposed to each other and include circular dome-shaped recesses 15 and 25, respectively. The pump housings 11 and 21 are fixed to each other with a peripheral edge portion 32 of the circular diaphragm 30 held therebetween. The pump housing 21 and the peripheral edge portion 32 are sealed with an O-ring 28.

The diaphragm 30 partitions an internal space defined by the recesses 15 and 25 of the pump housings 11 and 21. A pump chamber 16 includes a space defined by the recess 15 (the pump housing 11) and the diaphragm 30. A working chamber 26 includes a space defined by the recess 25 (the pump housing 21) and the diaphragm 30. The pump chamber 16 is to be filled with a photoresist (a chemical). The working chamber 26 is to be filled with working air (working gas).

The pump housing 11 includes a suction channel 12 and a discharge channel 13 that communicate with the pump chamber 16. A pipe is joined to the suction channel 12 to pass the photoresist to the pump chamber 16 (the diaphragm pump 10). A pipe is joined to the discharge channel 13 to pass the photoresist discharged from the diaphragm pump 10 to a supply destination.

The pump housing 21 includes a supply/exhaust channel 22 for supply and exhaust of the working air (compressed air) to and from the working chamber 26. A supply source of working air and a source of negative pressure are selectively connected to the supply/exhaust channel 22 via a pipe.

Figure 2:
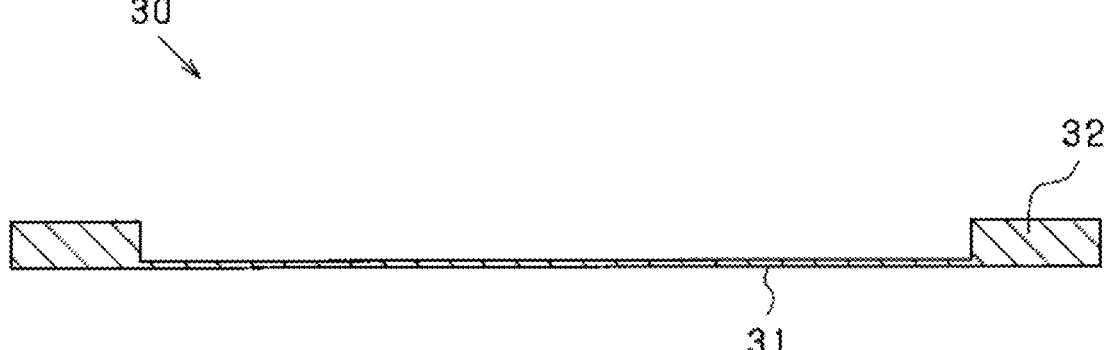
FIG. 2 is a cross-sectional view of a diaphragm.

As illustrated in FIG. 2, the diaphragm 30 includes a membrane portion 31 and a peripheral portion 32. The membrane portion 31 has a circular shape and the peripheral portion 32 has an annular shape. The diaphragm 30 is made of fluoroplastic that is resistant to the photoresist (the chemical) such as polytetrafluoroethylene (hereinafter may be referred to as "PTFE"), copolymer of tetrafluoroethylene and perfluoroalkyl vinyl ether (hereinafter may be referred to as "PFA"). The peripheral edge portion 32 is at an outer periphery of the membrane portion 31. The thickness of the peripheral portion 32 is greater than the thickness of the membrane portion 31. The thickness of the membrane portion 31 may be in the range of 0.1 to 0.3 [mm] (preferably 0.2 [mm]). The thickness of the peripheral portion 32 may be in the range of 1.5 to 4.0 [mm] (preferably 2 to 3.5 [mm]).

The diaphragm pump 10 operates as described below. FIG. 1 illustrates the diaphragm pump 10 in a discharge state in which the photoresist is discharged. In the discharge state, the working air is supplied to the working chamber 26 through the supply/exhaust channel 22, a pressure of the working air is applied to the diaphragm 30, and the diaphragm 30 deforms toward the pump chamber 16. This causes the discharge of the photoresist in the pump chamber 16 through the discharge channel 13.

When the working air is discharged through the supply/exhaust channel 22 and a negative pressure is applied to the working chamber 26, the diaphragm 30 deforms toward the recess 25 (toward the working chamber 26). This causes the suction of the photoresist into the pump chamber 16 through the suction channel 12.

By switching the internal pressure of the working chamber 26 between the positive pressure and the negative pressure, the discharge and the suction are repeatedly performed by the diaphragm pump 10. During the operation of the diaphragm pump 10 described above, a working pressure in the range of −50 to 300 [kPa] is applied to the working chamber 26. A working pressure in the range of −40 to 150 [kPa] may be applied to the working chamber 26. The pressure of the working air supplied to the working chamber 26 during the operation may be in the range of 150 to 300 [kPa].

The discloser has determined that the cause of the microbubbles is a slight amount of the working air that passes through the diaphragm when the pressure of the working air is applies to the diaphragm 30. The amount of working air that passes through the diaphragm may increase as the operating pressure and the area of the membrane portion 31 of the diaphragm 30 increase and the thickness of the membrane portion 31 decreases. The area of the diaphragm 30 in the diaphragm pump 10 tends to be set larger to increase a discharge amount of the photoresist (the chemical).

In this embodiment, the membrane portion 31 of the diaphragm 30 includes a permeation reduction layer that reduces the permeation of the working air through the diaphragm 30.

Figure 3:
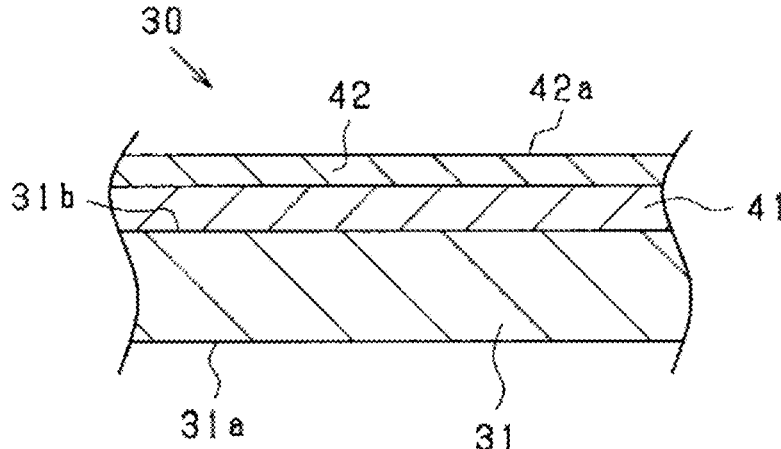
FIG. 3 is a magnified cross-sectional view of a membrane portion of the diaphragm and therearound.

FIG. 3 illustrates a magnified cross section of the membrane portion 31 and therearound of the diaphragm 30.

No layer is stacked on a surface 31a of the membrane portion 31, that is, the surface 31a of the membrane portion 31 directly contacts the photoresist.

The membrane portion 31 includes a surface 31b to which the pressure of the working air is applied and on which a permeation reduction layer 42 is disposed with the double-sided tape 41 between the surface 31b and the permeation reduction layer 42. That is, the permeation reduction layer 42 is attached to the surface 31b of the membrane portion 31 with the double-sided tape 41.

The permeation reduction layer 42 is made of polyvinylidene chloride (PVDC). The nitrogen permeability of the polyvinylidene chloride is $\frac{1}{1125}$ or less of the nitrogen permeability of PTFE. The oxygen permeability of the polyvinylidene chloride is $\frac{1}{690}$ or less of the oxygen permeability of PTFE. The thickness of the permeation reduction layer 42 may be in the range of 8 to 60 [µm], preferably 10 to 40 [µm] (e.g., 15 [µm]). The permeation reduction layer 42 is less likely to pass the working air in comparison to the membrane portion 31.

The permeation reduction layer 42 includes a surface 42a that is apart from the membrane portion 31 and on which no layer is stacked. That is, the surface 42a of the permeation reduction layer 42 directly contacts the working air.

Permeability coefficients [N2 (nitrogen)] ([Pa·m^3/(cm^2 sec·atm)]) of samples of the membrane portion 31 that were made of polyvinylidene chloride were measured. The polyvinylidene chloride is capable of reducing the permeation of the working gas through the diaphragm even when the pressure of the working air is applied to the diaphragm and thus the microbubbles in the chemical can be reduced. The permeability coefficients were different from one another according to the thicknesses of the samples of the membrane portion 31 as follows. Note that "^" represents a power. For example, 2^3 is a third power of 2. The permeability coefficients were 12.4×10^−9 for the thickness of 10 [µm], 8.5×10^−9 for the thickness of 15 [µm], and 4.6×10^−9 for the thickness of 40 [µm]. The Japanese Industrial Standards JIS K 7126-1:2006 Plastic-Film and Sheet-Gas Permeability Test Method is used for measuring the permeability coefficients.

Furthermore, with the permeability coefficient [N2] is in the range of 2.3×10^−9 to 18.7×10^−9, even if the pressure of the working gas is applied to the diaphragm, the permeation of the working gas through the diaphragm can be reduced and thus the microbubbles in the chemical can be reduced.

The double-sided tape 41 includes a film base and adhesives (adhesive layers) on both surfaces of the base. A nonwoven fabric, a polyester film, or a poly ethylene terephthalate (PET) film may be used for the base. An acrylic adhesive or an emulsion adhesive may be used for the adhesives. The base and the adhesives have flexibility. The thickness of the double-sided tape 41 may be in the range of 5 to 300 [µm], preferably 10 to 100 [µm]. That is, the thickness of the double-sided tape 41 is preferably equal to or less than the thickness of the membrane portion 31 (e.g., 0.2 [mm]).

In general, the surface of the membrane portion 31 that is made of a fluoroplastic is inert and thus attachment of other members to the surface may be difficult. Therefore, the membrane portion 31 and the double-sided tape 41 are surface-treated to activate the surface of the membrane portion 31 (the surface treatment is not illustrated). A surface treatment agent may contain metallic sodium (Na). This can improve the bonding between the membrane portion 31 and the adhesive agent of the double-sided tape 41.

When the thickness of the permeation reduction layer 42 was in the range of 10 to 40 [µm] and the thickness of the double-sided tape 41 was in the range of 10 to 100 [µm], the permeation reduction layer 42 sufficiently reduced the permeation of the working air and no problem was observed in the function of the diaphragm 30.

The embodiments described in detail above have the following advantages.

The membrane portion 31 of the diaphragm 30 is made of the fluoroplastic that is resistant to the photoresist. Therefore, the membrane portion 31 is less likely to be corroded by the photoresist. The permeation reduction layer 42 that is less likely to pass the operating air in comparison to the membrane portion 31 is disposed on the surface 31b of the membrane portion 31 to which the pressure of the operating air is applied. According to the configuration, even when the pressure of the operating air is applied to the diaphragm 30, the operating air is less likely to pass through the diaphragm 30. Therefore, microbubbles in the photoresist can be reduced.

The permeation reduction layer 42 is disposed on the surface 31b of the membrane portion 31 to which the pressure of the operating air is applied, that is, apart from the surface 31a that contacts the photoresist. Therefore, the permeation reduction layer 42 is less likely to be corroded by the photoresist.

The permeation reduction layer 42 is attached to the membrane portion 31 with the double-sided tape 41 that is flexible (i.e., deformable). According to the configuration, the double-sided tape 41 and the permeation reduction layer 42 can more easily deform along the deformation of the membrane portion 31 in comparison to a configuration in which the permeation reduction layer 42 is attached to the membrane portion 31 with a curable adhesive. Further, when the pressure of the operating air is applied to the membrane portion 31 and the membrane portion 31 is deformed, a force may be exerted on the permeation reduction layer 42 by the membrane portion 31. Such a force can be absorbed by the double-sided tape 41. Therefore, the permeation reduction layer 42 is less likely to be peeled off from the membrane portion 31 or to be damaged.

The membrane portion 31 and the double-sided tape 41 are surface-treated to activate the surface of the membrane portion 31. Therefore, the surface of the membrane portion 31 made of the fluoroplastic can be activated and thus the bonding between the membrane portion 31 and the double-sided tape 41 can be improved. Although the membrane portion 31 may be repeatedly deformed, the double-sided tape 41 and the permeation reduction layer 42 are less likely to be peeled off from the membrane portion 31.

The permeation reduction layer 42 is made of polyvinylidene chloride. The polyvinylidene chloride has an advantageous effect in reducing the permeation of gas. This has been confirmed by the discloser. Therefore, even if the pressure of the working air is high, the working air is less likely to pass through the diaphragm 30.

The thickness of the permeation reduction layer 42 is in the range of 10 to 40 [µm]. The permeation reduction layer 42 that has the thickness of 10 [µm] or greater can achieve an advantageous gas barrier property and the permeation reduction layer 42 that has the thickness of 40 [µm] or less is less likely to adversely affect the function of the diaphragm 30. This has been confirmed by the discloser.

The permeability coefficient of the permeation reduction layer 42 is in the range of 4.6×10^−9 to 12.4×10^−9 [N2]. According to the configuration, the permeation reduction layer 42 can achieve a sufficient gas barrier property. Furthermore, even if the permeability coefficient is in the range of 2.3×10^−9 to 18.7×10^−9, the permeation reduction layer 42 can achieve a sufficient gas barrier property.

The permeation reduction layer 42 includes the surface 42a that is apart from the membrane portion 31 and on which no layer is stacked. Further, the membrane portion 31 includes the surface 31a that contacts the photoresist and on which no layer is stacked. The diaphragm 30 has a minimum required configuration, that is, a layer that disturbs the deformation of the membrane portion 31 does not exist.

The diaphragm 30 in the diaphragm pump 10 is less likely to pass through the working air.

In the diaphragm pump 10 in which the pressure of the operating air in the range of 150 to 300 [kPa] is applied to the diaphragm 30, the operating air is less likely to pass through the diaphragm 30.

The embodiment can be modified as follows. The same parts as those in the embodiment are denoted by the same reference signs, and will not be described.

The pressure of the working air supplied to the working chamber 26 may be less than 150 [kPa] or greater than 300 [kPa].

The pressure of the working air supplied to the working chamber 26 may be in the range of 150 to 200 [kPa].

The double-sided tape 41 may be replaced with a single-layer adhesive layer (an adhesive). The membrane portion 31 and the permeation reduction layer 42 may be bonded to each other with an adhesive. A flexible adhesive is preferable; however, a curable liquid adhesive may be used. The thicknesses of the adhesive layer and the adhesive may be in the range of 5 to 300 [μm], preferably 10 to 100 [μm]. That is, preferable thicknesses of the adhesive layer and the adhesive may be equal to or less than the thickness of the membrane portion 31 (e.g., 200 [μm]).

The diaphragm pump 10 may be used in a system that performs a degassing process to remove air bubbles in photoresists by passing the photoresists through a filter.

Examples of the fluid control device in which the diaphragm 30 is used include a diaphragm-type valve and a diaphragm-type regulator that adjusts pressures of chemicals. In the examples of the fluid control device, the permeation reduction layer 42 can reduce the permeation of the working air under pressure through the diaphragm. In the fluid control device in which a negative pressure is not applied to the diaphragm 30, the permeation reduction layer 42 may be disposed to directly contact the membrane portion 31 of the diaphragm 30. In such a device, the membrane portion 31 and the permeation reduction layer 42 may be held together with an electrostatic force or a vacuum force and thus the permeation reduction layer 42 is less likely to be peeled off from the membrane portion 31. According to the configuration, the double-sided tape 41 is not required and thus the number of parts of the diaphragm 30 can be reduced.

The permeation reduction layer 42 may be made of ethylene-vinyl alcohol copolymer (EVOH). If the thicknesses are the same, the permeability coefficient [N2] of EVOH is about 1/10 of the permeability coefficient [N2] of PVDC. Even if the pressure of the working gas is applied to the diaphragm that includes the permeation reduction layer 42 made of EVOH, as long as the permeability coefficient [N2] is in the range of $2.3\times10^\wedge{-}10$ to $18.7\times10^\wedge{-}9$, the permeation of the working gas through the diaphragm can be reduced and thus the microbubbles in the chemical solution can be reduced. The permeation reduction layer 42 may be made of another gas barrier film.

The permeation reduction layer 42 may be made of metallic film that contains aluminum (Al) or gold (Au). The metal film may be formed by vacuum deposition. In general, the gas permeability of the metal film is less than the gas permeability of the plastic film.

The working gas is not limited to air. A different type of gas such as nitrogen, oxygen, and argon (Ar) may be used. The chemical, the flow of which is controlled by the fluid control device, may be a photoresist developer or a cleaning solution. Even if such a chemical is used, the permeation reduction layer 42 can reduce the adverse effect of microbubbles on the development of the photoresist or cleaning of wafers.

The present disclosure has been described in conformity with examples but is not limited to the examples and the structures therein. Further, the present disclosure encompasses a variety of variation examples and variations in the scope of equivalents of the present disclosure. In addition, a variety of combinations and forms and even other combinations and forms to which only one element or two or more elements are added fall within the scope and ideological range of the present disclosure.

What is claimed is:

1. A diaphragm disposed in a chemical flow control device that controls a flow of a chemical in a semiconductor manufacturing process, the diaphragm comprising:
   a membrane portion that is made of fluoroplastic that is resistant to the chemical; and
   a permeation reduction layer that is made of polyvinylidene chloride or ethylene-vinyl alcohol copolymer and that is less likely to pass a working gas in comparison to the membrane portion and disposed on a surface of the membrane portion to which a pressure of the working gas is applied.

2. The diaphragm according to claim 1, wherein the permeation reduction layer is attached to the membrane portion with a double-sided tape.

3. The diaphragm according to claim 2, wherein the membrane portion and the double-sided tape are surface-treated to activate the surface of the membrane portion.

4. The diaphragm according to claim 1, wherein the permeation reduction layer has a thickness in a range of 10 to 40 μm.

5. The diaphragm according to claim 1, wherein
   the permeation reduction layer includes a surface that is apart from the membrane portion and on which no layer is stacked, and
   the membrane portion includes a surface that contacts the chemical and on which no layer is stacked.

6. The diaphragm according to claim 1, wherein the permeation reduction layer has a permeability coefficient in a range of $2.3\times10^\wedge{-}10$ to $18.7\times10^\wedge{-}9$.

7. A chemical flow control device comprising the diaphragm according to claim 1, wherein the chemical flow control device is used as a pump for suction and discharge of the chemical according to deformation of the diaphragm.

8. The chemical flow control device according to claim 7, wherein the pressure of the working gas applied to the diaphragm is in a range of 150 to 300 kPa.

9. The chemical flow control device according to claim 7, wherein the permeation reduction layer has a permeability coefficient in a range of $2.3\times10^\wedge{-}10$ to $18.7\times10^\wedge{-}9$.

10. The diaphragm according to claim 2, wherein the permeation reduction layer has a thickness in a range of 10 to 40 μm.

11. The diaphragm according to claim 2, wherein
    the permeation reduction layer includes a surface that is apart from the membrane portion and on which no layer is stacked, and
    the membrane portion includes a surface that contacts the chemical and on which no layer is stacked.

12. The diaphragm according to claim 2, wherein the permeation reduction layer has a permeability coefficient in a range of $2.3\times10^\wedge{-}10$ to $18.7\times10^\wedge{-}9$.

13. A chemical flow control device comprising the diaphragm according to claim 2, wherein the chemical flow control device is used as a pump for suction and discharge of the chemical according to deformation of the diaphragm.

14. The chemical flow control device according to claim 13, wherein the pressure of the working gas applied to the diaphragm is in a range of 150 to 300 kPa.

15. The chemical flow control device according to claim 13, wherein the permeation reduction layer has a permeability coefficient in a range of $2.3 \times 10^{-10}$ to $18.7 \times 10^{-9}$.

16. The diaphragm according to claim 3, wherein the permeation reduction layer has a thickness in a range of 10 to 40 $\mu$m.

17. The diaphragm according to claim 3, wherein the permeation reduction layer includes a surface that is apart from the membrane portion and on which no layer is stacked, and the membrane portion includes a surface that contacts the chemical and on which no layer is stacked.

18. A diaphragm disposed in a chemical flow control device that controls a flow of a chemical in a semiconductor manufacturing process, the diaphragm comprising:

a membrane portion that is made of fluoroplastic that is resistant to the chemical; and a permeation reduction layer that has a permeability coefficient to pass the working gas in a range of $2.3 \times 10^{-10}$ to $18.7 \times 10^{-9}$ and that is lower than the membrane portion, wherein the permeation reduction layer is disposed on a surface of the membrane portion to which a pressure of a working gas is applied.

* * * * *